United States Patent
Yamada et al.

(10) Patent No.: US 12,104,087 B2
(45) Date of Patent: Oct. 1, 2024

(54) COMPOSITION FOR CHEMICAL-MECHANICAL POLISHING AND CHEMICAL-MECHANICAL POLISHING METHOD

(71) Applicant: JSR CORPORATION, Tokyo (JP)

(72) Inventors: Yuuya Yamada, Tokyo (JP); Pengyu Wang, Tokyo (JP); Norihiko Sugie, Tokyo (JP); Yasutaka Kamei, Tokyo (JP)

(73) Assignee: JSR CORPORATION, Tokyo (JP)

( * ) Notice: Subject to any disclaimer, the term of this patent is extended or adjusted under 35 U.S.C. 154(b) by 250 days.

(21) Appl. No.: 17/775,887

(22) PCT Filed: Oct. 12, 2020

(86) PCT No.: PCT/JP2020/038480
§ 371 (c)(1),
(2) Date: May 11, 2022

(87) PCT Pub. No.: WO2021/095414
PCT Pub. Date: May 20, 2021

(65) Prior Publication Data
US 2022/0389279 A1 Dec. 8, 2022

(30) Foreign Application Priority Data

Nov. 15, 2019 (JP) ................................. 2019-206905

(51) Int. Cl.
*C09G 1/02* (2006.01)
*C09K 3/14* (2006.01)
(Continued)

(52) U.S. Cl.
CPC ............. *C09G 1/02* (2013.01); *C09K 3/1436* (2013.01); *C09K 13/00* (2013.01); *H01L 21/3212* (2013.01); *H01L 21/7684* (2013.01)

(58) Field of Classification Search
None
See application file for complete search history.

(56) References Cited

U.S. PATENT DOCUMENTS

| | | | |
|---|---|---|---|
| 2017/0009101 A1* | 1/2017 | Yasui | B24B 37/044 |
| 2019/0211228 A1* | 7/2019 | Ward | H01L 21/3212 |
| 2022/0177318 A1* | 6/2022 | Otsuki | C01B 33/141 |

FOREIGN PATENT DOCUMENTS

| | | |
|---|---|---|
| JP | 2016030831 | 3/2016 |
| JP | 2017514295 | 6/2017 |

OTHER PUBLICATIONS

Yamaguchi et al, "Novel Silane Coupling Agents Containing a Photolabile 2-Nitrobenzyl Ester for Introduction of a Carboxy Group on the Surface of Silica Gel", Chemistry Letter 2000, pp. 228-229. (Year: 2000).*

(Continued)

*Primary Examiner* — Binh X Tran
(74) *Attorney, Agent, or Firm* — JCIPRNET (57) ABSTRACT

Provided are a chemical-mechanical polishing composition and a chemical-mechanical polishing method capable of polishing a semiconductor substrate containing a conductive metal such as tungsten or cobalt flatly and at high speed as well as reducing surface defects after polishing. The composition for chemical-mechanical polishing contains (A) silica particles having a functional group represented by general formula (1) and (B) a silane compound. —COO-M+ ... (1) (M+ represents a monovalent cation.)

20 Claims, 2 Drawing Sheets

(51) Int. Cl.
*C09K 13/00* (2006.01)
*H01L 21/321* (2006.01)
*H01L 21/768* (2006.01)

(56) References Cited

OTHER PUBLICATIONS 3-mercaptopropyltrimethoxysilane via https://www.sigmaaldrich.com/US/en/product/aldrich/175617 (Year: 2024).*

"International Search Report (Form PCT/ISA/210) of PCT/JP2020/038480", mailed on Dec. 22, 2020, with English translation thereof, pp. 1-6.

"Office Action of Tawian Counterpart Application", issued on Sep. 13, 2021, with English translation thereof, p. 1-p. 10.

* cited by examiner

COMPOSITION FOR CHEMICAL-MECHANICAL POLISHING AND CHEMICAL-MECHANICAL POLISHING METHOD

CROSS-REFERENCE TO RELATED APPLICATION

This application is a 371 application of the International PCT application serial no. PCT/JP2020/038480, filed on Oct. 12, 2020, which claims the priority benefit of Japan Patent Application No. 2019-206905, filed on Nov. 15, 2019. The entirety of each of the above-mentioned patent applications is hereby incorporated by reference herein and made a part of this specification.

TECHNICAL FIELD

The present invention relates to a chemical mechanical polishing composition and a chemical mechanical polishing method.

BACKGROUND ART

The miniaturization of a wiring layer made of wiring, plugs, and the like formed in a semiconductor device is progressing. Along with this, a method of flattening the wiring layer by chemical-mechanical polishing (hereinafter also referred to as "CMP") has been used. The ultimate objective of such a CMP is to flatten a surface to be polished to obtain a defect-free and corrosion-free surface after polishing. Therefore, the composition for chemical-mechanical polishing used in CMP is evaluated based on characteristics such as material removal rate, surface defect product rate after polishing, and metal corrosion prevention after polishing.

In recent years, due to further miniaturization of wiring layers, tungsten (W) and cobalt (Co) have begun to be applied as conductive metals. Therefore, it is required that excessive laminated tungsten and cobalt be able to be efficiently removed by CMP, and the corrosion of tungsten and cobalt be suppressed to form a good surface state. Regarding such chemical-mechanical polishing of tungsten and cobalt, compositions for chemical-mechanical polishing containing various additives have been proposed (for example, refer to Patent Literature 1 and Patent Literature 2).

CITATION LIST

Patent Literature

Patent Literature 1: PCT Japanese Translation Patent Publication No. 2017-514295
Patent Literature 2: Japanese Patent Laid-Open No. 2016-030831

SUMMARY OF INVENTION

Technical Problem

With the widespread use of semiconductor wafers containing conductive metals such as tungsten and cobalt, a composition for chemical-mechanical polishing and a chemical-mechanical polishing method capable of polishing a semiconductor substrate containing a conductive metal such as tungsten and cobalt flatly and at high speed as well as reducing surface defects after polishing, are required.

Solution to Problem

According to an aspect of the present invention, there is provided a composition for chemical-mechanical polishing containing (A) silica particles having a functional group represented by general formula (1) below, and (B) a silane compound.

$$-COO^-M^+ \quad (1)$$

($M^+$ represents a monovalent cation)

In the composition for chemical-mechanical polishing according to the aspect, when a total mass of the composition for chemical-mechanical polishing is 100% by mass, a content of the component (A) may be 0.10% by mass or more and 10% by mass or less, and a content of the component (B) may be 0.0001% by mass or more and 0.02% by mass or less.

In the composition for chemical-mechanical polishing according to any aspect, the component (A) may be silica particles in which the functional group represented by the general formula (1) is fixed on a surface thereof via a covalent bond.

In the composition for chemical-mechanical polishing according to any aspect, the component (B) may be at least one selected from compounds represented by the following general formulas (2), (3), and (4).

$$Si(OR^1)_4 \quad (2)$$

$$SiR^2_m(OR^3)_n(R^4-NR^5_2)_p \quad (3)$$

$$SiR^2_m(OR^3)_n R^5_p \quad (4)$$

(In Formula (2), each of a plurality of $R^1$ independently represents a monovalent hydrocarbon group. In Formula (3), $R^4$ represents a divalent hydrocarbon group. In Formulas (3) and (4), each of $R^2$ and $R^3$ independently represents a monovalent hydrocarbon group, $R^5$ represents hydrogen atoms or a monovalent organic group having 1 to 10 carbon atoms each independently containing or not containing heteroatoms, m is an integer of 0 to 2, n is an integer of 1 to 3, p is 1 or 2, and m+n+p=4.)

In the composition for chemical-mechanical polishing according to any aspect, the component (B) may be at least one selected from tetramethoxysilane, tetraethoxysilane, tetrapropoxysilane, tetraphenoxysilane, 3-aminopropyltrimethoxysilane, N-(2-aminoethyl)-3-aminopropyltrimethoxysilane, 3-aminopropyltriethoxysilane, aminopropyldimethylethoxysilane, aminopropylmethyldiethoxysilane, N-phenyl-3-aminopropyltrimethoxysilane, 3-trimethoxysilylpropyl succinic anhydride, 3-triethoxysilylpropyl succinic anhydride, 3-mercaptopropylmethyldimethoxysilane, and 3-mercaptopropyltrimethoxysilane.

In the composition for chemical-mechanical polishing according to any aspect, an organic acid may further be contained.

In the composition for chemical-mechanical polishing according to any aspect, an oxidizing agent may further be contained.

In the composition for chemical-mechanical polishing according to any aspect, a pH may be 2 or more and 5 or less.

According to another aspect of the present invention, there is provided a chemical-mechanical polishing method including: a step of polishing a semiconductor substrate using the composition for chemical-mechanical polishing according to any aspect.

In the chemical-mechanical polishing method according to the aspect, the semiconductor substrate may have a part containing at least one selected from a group consisting of silicon oxide and tungsten.

Advantageous Effects of Invention

According to the composition for chemical-mechanical polishing according to the present invention, it is possible to polish a semiconductor substrate containing a conductive metal such as tungsten or cobalt flatly and at high speed, and reduce surface defects after polishing.

DESCRIPTION OF EMBODIMENTS

Hereinafter, appropriate embodiments of the present invention will be described in detail. In addition, the present invention is not limited to the following embodiments, and includes various modifications implemented without changing the gist of the present invention.

In the present specification, a numerical range described as "X to Y" is interpreted as including the numerical value X as the lower limit value and the numerical value Y as the upper limit value.

1. Composition for Chemical-Mechanical Polishing

A composition for chemical-mechanical polishing according to an embodiment of the present invention contains (A) silica particles having a functional group represented by general formula (1) below (in the present specification, simply referred to as "Component (A)"), and (B) a silane compound (in the present specification, simply referred to as "Component (B)").

(1)

($M^+$ represents a monovalent cation)
Hereinafter, each component contained in the composition for chemical-mechanical polishing according to the present embodiment will be described in detail.
1.1. Component (A)
The composition for chemical-mechanical polishing according to the present embodiment contains (A) silica particles having a functional group represented by the following general formula (1) as an abrasive grain component.

(1)

($M^+$ represents a monovalent cation)
The monovalent cation represented by $M^+$ is not limited to the following examples, and examples thereof include $H^+$, $Li^+$, $Na^+$, $K^+$, and $NH_4^+$. In other words, the component (A) can be referred to as "(A) silica particles having at least one functional group selected from the group consisting of a carboxy group and salts thereof". Here, the "salt of a carboxy group" refers to a functional group in which a hydrogen ion contained in a carboxy group (—COOH) is substituted with a monovalent cation such as $Li^+$, $Na^+$, $K^+$, $NH_4^+$, or the like. The component (A) is a silica particle in which a functional group represented by the general formula (1) is fixed on the surface thereof via a covalent bond, and does not include a compound having a functional group represented by the above general formula (1), which is physically or ionically adsorbed on the surface thereof.

The component (A) used in the present embodiment can be produced, for example, as follows.

First, silica particles are prepared. Examples of the silica particles include fumed silica and colloidal silica, but colloidal silica is preferable from the viewpoint of reducing polishing defects such as scratches. As the colloidal silica, for example, those produced by the method described in Japanese Patent Laid-Open No. 2003-109921 can be used. By modifying the surface of such silica particles, the component (A) that can be used in the present embodiment can be produced. Hereinafter, a method for modifying the surface of silica particles will be exemplified, but the present invention is not limited to this specific example.

For the surface modification of the silica particles, the methods described in Japanese Patent Laid-Open No. 2005-162533 or Japanese Patent Laid-Open No. 2010-269985 can be applied. For example, the silica particles and a carboxy group-containing silane coupling agent (for example, (3-triethoxysilyl)propylsuccinic anhydride) are mixed and sufficiently stirred, and accordingly, the carboxy group-containing silane coupling agent can be covalently bonded on the surface of the silica particles. By further heating and hydrolyzing, silica particles in which the carboxy group is fixed via a covalent bond can be obtained.

The lower limit value of the average particle size of the component (A) is preferably 15 nm, and more preferably 30 nm. The upper limit value of the average particle size of the component (A) is preferably 100 nm, and more preferably 70 nm. When the average particle size of the component (A) is within the above ranges, a semiconductor substrate containing a conductive metal such as tungsten or cobalt may be polished at a practical polishing speed while suppressing the occurrence of polishing defects. The average particle size of the component (A) can be obtained by measuring the produced composition for chemical-mechanical polishing with a particle size measuring device by a dynamic light scattering method. Examples of the particle size measuring device for the dynamic light scattering method include a nanoparticle analyzer "DelsaNano S" manufactured by Beckman Coulter KK and "Zetasizer nano zs" manufactured by Malvern. The average particle size measured by the dynamic light scattering method represents the average particle size of the secondary particles formed by aggregating a plurality of primary particles.

The zeta potential of the component (A) is a negative potential in the composition for chemical-mechanical polishing when the pH of the composition for chemical-mechanical polishing is 1 or more and 6 or less, and the negative potential is preferably −10 mV or less. When the negative potential is −10 mV or less, the electrostatic repulsive force between the particles effectively may prevent the particles from aggregating with each other, and the substrate carrying a positive charge may be selectively polished during chemical-mechanical polishing. Examples of the zeta potential measuring device include "ELSZ-1" manufactured by Otsuka Electronics Co., Ltd., "Zetasizer nano zs" manufactured by Malvern, and the like. The zeta potential of the component (A) can be appropriately adjusted by increasing or decreasing the amount of the above-mentioned carboxy group-containing silane coupling agent added.

The lower limit value of the content of the component (A) is preferably 0.1% by mass, more preferably 0.5% by mass, and particularly preferably 1% by mass when the total mass of the composition for chemical-mechanical polishing is 100% by mass. The upper limit value of the content of the component (A) is preferably 10% by mass, more preferably 8% by mass, and particularly preferably 5% by mass when the total mass of the composition for chemical-mechanical polishing is 100% by mass. When the content of the component (A) is within the above range, a semiconductor substrate containing a conductive metal such as tungsten or cobalt may be polished at a practical polishing speed while suppressing the occurrence of polishing defects.

1.2. Component (B)

The composition for chemical-mechanical polishing according to the present embodiment contains a silane compound (B). Due to the component (B) being contained, it is considered that the component (B) is adsorbed on the surface to be polished in the polishing step, and a metal such as a wiring metal exposed on the surface to be polished is condensed as a catalyst to form a protective film. Accordingly, the semiconductor substrate containing a conductive metal such as tungsten or cobalt may be polished at a practical polishing speed while suppressing the occurrence of polishing defects.

As the component (B), for example, silane compounds represented by the following general formulas (2), (3), and (4) can be preferably used.

$$Si(OR^1)_4 \qquad (2)$$

In Formula (2), each of a plurality of $R^1$ independently represents a monovalent hydrocarbon group. The monovalent hydrocarbon group is preferably a linear or branched alkyl group having 1 to 4 carbon atoms or an aryl group having 6 to 12 carbon atoms. Examples of the linear or branched alkyl group having 1 to 4 carbon atoms include a methyl group, an ethyl group, an n-propyl group, an isopropyl group, an n-butyl group, a 2-methylpropyl group, a 1-methylpropyl group, and a tert-butyl group. Examples of the aryl group having 6 to 12 carbon atoms include a phenyl group and a naphthyl group.

Specific examples of the silane compound represented by the general formula (2) include tetramethoxysilane, tetraethoxysilane, tetrapropoxysilane, and tetraphenoxysilane.

$$SiR^2_m(OR^3)_n(R^4\text{—}NR^5_2)_p \qquad (3)$$

$$SiR^2_m(OR^3)_n R^5_p \qquad (4)$$

In Formulas (3) and (4), each of $R^2$ and $R^3$ independently represents a monovalent hydrocarbon group, $R^5$ represents hydrogen atoms or a monovalent organic group having 1 to 10 carbon atoms each independently containing or not containing heteroatoms, m is an integer of 0 to 2, n is an integer of 1 to 3, p is 1 or 2, and m+n+p=4. In Formula (3), $R^4$ represents a divalent hydrocarbon group.

The monovalent hydrocarbon group represented by $R^2$ and $R^3$ is preferably a linear or branched alkyl group having 1 to 4 carbon atoms or an aryl group having 6 to 12 carbon atoms. Examples of the linear or branched alkyl group having 1 to 4 carbon atoms include a methyl group, an ethyl group, an n-propyl group, an isopropyl group, an n-butyl group, a 2-methylpropyl group, a 1-methylpropyl group, and a tert-butyl group. Examples of the aryl group having 6 to 12 carbon atoms include a phenyl group and a naphthyl group.

Examples of the divalent hydrocarbon group represented by $R^4$ include a linear or branched divalent hydrocarbon group having 1 to 10 carbon atoms. Among these, an alkanediyl group having 1 to 4 carbon atoms is preferable. Examples of the alkanediyl group having 1 to 4 carbon atoms include a methylene group, an ethylene group, a propylene group, an isopropylene group, a butylene group, and an isobutylene group.

Examples of monovalent organic groups having 1 to 10 carbon atoms, containing or not containing heteroatoms, represented by $R^5$ include linear, branched, or cyclic hydrocarbon groups having 1 to 10 carbon atoms. Among these, an alkyl group having 1 to 4 carbon atoms or a cycloalkylalkyl group having 5 to 9 carbon atoms is preferable. Examples of the alkyl group having 1 to 4 carbon atoms include a methyl group, an ethyl group, an n-propyl group, an isopropyl group, an n-butyl group, a 2-methylpropyl group, a 1-methylpropyl group, and a tert-butyl group. Examples of the cycloalkylalkyl group having 5 to 9 carbon atoms include a cyclobutylmethyl group, a cyclopentylmethyl group, a cyclohexylmethyl group, a cyclobutylethyl group, a cyclopentylethyl group, a cyclohexylethyl group, a cyclobutylpropyl group, a cyclopentylpropyl group, and a cyclohexylpropyl group.

Specific examples of the silane compound represented by the above general formula (3) include 3-aminopropyltrimethoxysilane, N-(2-aminoethyl)-3-aminopropyltrimethoxysilane, 3-aminopropyltriethoxysilane, aminopropyldimethylethoxysilane, aminopropylmethyldiethoxysilane, and N-phenyl-3-aminopropyltrimethoxysilane.

Specific examples of the silane compound represented by the above general formula (4) include 3-trimethoxysilylpropyl succinic anhydride, 3-triethoxysilylpropyl succinic anhydride, 3-mercaptopropylmethyldimethoxysilane, and 3-mercaptopropyltrimethoxysilane.

These components (B) may be used alone or in combination of two or more.

The lower limit value of the content of the component (B) is preferably 0.0001% by mass, more preferably 0.0005% by mass, and particularly preferably 0.001% by mass when the total mass of the composition for chemical-mechanical polishing is 100% by mass. The upper limit value of the content of the component (B) is preferably 0.05% by mass, more preferably 0.03% by mass, still more preferably 0.02% by mass, and particularly preferably 0.015% by mass when the total mass of the composition for chemical-mechanical polishing is 100% by mass. When the content of the component (B) is within the above range, a protective film having an appropriate thickness can be formed on the surface of a conductive metal such as tungsten or cobalt, and polishing is possible at a practical polishing speed while suppressing the occurrence of polishing defects.

1.3. Liquid Medium

The composition for chemical-mechanical polishing according to the present embodiment contains a liquid medium. Examples of the liquid medium include water, a mixed medium of water and alcohol, and a mixed medium containing water and an organic solvent compatible with water. Among these, it is preferable to use water, a mixed medium of water and alcohol, and it is more preferable to use water. The water is not particularly limited, but pure water is preferable. Water may be incorporated as the remainder of the constituent material of the composition for chemical-mechanical polishing, and the content of water is not particularly limited.

1.4. Other Additives

The composition for chemical-mechanical polishing according to the present embodiment may further contain additives such as an oxidizing agent, an organic acid, a surfactant, a water-soluble polymer, an anticorrosive, and a pH adjuster, if necessary. Hereinafter, each additive will be described.

<Oxidizing Agent>

The composition for chemical-mechanical polishing according to the present embodiment may contain an oxidizing agent. Due to an oxidizing agent being contained, a metal such as tungsten or cobalt is oxidized to promote complexation with the polishing solution component. Accordingly, a fragile modified layer can be created on the surface to be polished, and thus the polishing speed may be improved.

Examples of the oxidizing agent include ammonium persulfate, potassium persulfate, hydrogen peroxide, ferric nitrate, diammonium cerium nitrate, potassium hypochlorite, ozone, potassium periodate, peracetic acid, and the like. Among these oxidizing agents, ammonium persulfate, potassium persulfate, and hydrogen peroxide are preferable, and hydrogen peroxide is more preferable, in consideration of oxidizing power and ease of handling. These oxidizing agents may be used alone or in combination of two or more.

When the composition for chemical-mechanical polishing according to the present embodiment contains an oxidizing agent, the content of the oxidizing agent is preferably 0.1 to 5% by mass, more preferably 0.3 to 4% by mass, and particularly preferably 0.5 to 3% by mass when the total mass of the composition for chemical-mechanical polishing is 100% by mass. Since the oxidizing agent is easily decomposed in the composition for chemical-mechanical polishing, it is desirable that the oxidizing agent be added immediately before the polishing step of CMP.

<Organic Acid>

The composition for chemical-mechanical polishing according to the present embodiment may contain an organic acid. Due to an organic acid being contained, the organic acid may be coordinated to the surface to be polished to improve the polishing speed, and the precipitation of metal salts may be suppressed during polishing. Further, by coordinating an organic acid to the surface to be polished, damage due to etching and corrosion of the surface to be polished may be reduced.

Such organic acids are not particularly limited, but examples thereof include saturated carboxylic acids such as malonic acid, citric acid, malic acid, tartaric acid, oxalic acid, lactic acid, and iminodiacetic acid; unsaturated monocarboxylic acids such as acrylic acid, methacrylic acid, crotonic acid, 2-butenoic acid, 2-methyl-3-butenoic acid, 2-hexenoic acid, 3-methyl-2-hexenoic acid; unsaturated dicarboxylic acids such as maleic acid, fumaric acid, citraconic acid, mesaconic acid, 2-pentenodiic acid, itaconic acid, allylmaronic acid, isopropyridene succinic acid, 2,4-hexadienodic acid, and acetylenedicarboxylic acid; aromatic carboxylic acids such as trimellitic acid; amino acids such as glycine, alanine, aspartic acid, glutamic acid, lysine, arginine, tryptophan, histidine, aromatic amino acids, and heterocyclic amino acids; and salts thereof. These organic acids may be used alone or in combination of two or more.

When the composition for chemical-mechanical polishing according to the present embodiment contains an organic acid, the content of the organic acid is preferably 0.01 to 5% by mass, more preferably 0.03 to 1% by mass, and particularly preferably 0.1 to 0.5% by mass when the total mass of the composition for chemical-mechanical polishing is 100% by mass.

<Surfactant>

The composition for chemical-mechanical polishing according to the present embodiment may contain a surfactant. Due to a surfactant being contained, an appropriate viscosity may be imparted to the composition for chemical-mechanical polishing. The viscosity of the composition for chemical-mechanical polishing is preferably adjusted to be 0.5 mPa·s or more and less than 10 mPa·s at 25° C.

The surfactant is not particularly limited, and examples thereof include anionic surfactants, cationic surfactants, and nonionic surfactants.

Examples of the anionic surfactant include carboxylates such as fatty acid soaps and alkyl ether carboxylates; sulfonates such as alkylbenzene sulfonates, alkylnaphthalene sulfonates, and α-olefin sulfonates; sulfates such as higher alcohol sulfates, alkyl ether sulfates, polyoxyethylene alkylphenyl ether sulfates; and fluorine-based surfactants such as perfluoroalkyl compounds. Examples of the cationic surfactant include aliphatic amine salts and aliphatic ammonium salts. Examples of the nonionic surfactant include a nonionic surfactant having a triple bond such as acetylene glycol, an acetylene glycol ethylene oxide adduct, and an acetylene alcohol; and a polyethylene glycol type surfactant. These surfactants may be used alone or in combination of two or more.

When the composition for chemical-mechanical polishing according to the present embodiment contains a surfactant, the content of the surfactant is preferably 0.001 to 5% by mass, more preferably 0.001 to 3% by mass, and particularly preferably 0.01 to 1% by mass when the total mass of the composition for chemical-mechanical polishing is 100% by mass.

<Water-Soluble Polymer>

The composition for chemical-mechanical polishing according to the present embodiment may contain a water-soluble polymer. The water-soluble polymer has the effect of being adsorbed to the surface of the surface to be polished and reducing polishing friction. Due to this effect, the occurrence of polishing defects on the surface to be polished may be reduced.

Examples of the water-soluble polymer include poly(meth)acrylamide, poly(meth)acrylic acid, polyvinyl alcohol, polyvinylpyrrolidone, hydroxyethyl cellulose, carboxymethyl cellulose, and a copolymer of (meth)acrylic acid and maleic acid.

The weight average molecular weight (Mw) of the water-soluble polymer is preferably 1,000 to 1,000,000, and more preferably 3,000 to 800,000. When the weight average molecular weight of the water-soluble polymer is within the above range, the water-soluble polymer is likely to be adsorbed on the surface to be polished such as a wiring material, and polishing friction may be further reduced. As a result, the occurrence of polishing defects on the surface to be polished may be effectively reduced. The "weight average molecular weight (Mw)" in the present specification refers to a weight average molecular weight equivalent to polyethylene glycol, which is measured by gel permeation chromatography (GPC).

When the composition for chemical-mechanical polishing according to the present embodiment contains a water-soluble polymer, the content of the water-soluble polymer is preferably 0.01 to 1% by mass, and more preferably 0.03 to 0.5% by mass, when the total mass of the composition for chemical-mechanical polishing is 100% by mass.

The content of the water-soluble polymer depends on the weight average molecular weight (Mw) of the water-soluble polymer, but it is preferable to adjust the viscosity of the composition for chemical-mechanical polishing at 25° C. to be 0.5 mPa·s or more and less than 10 mPa·s. When the viscosity of the composition for chemical-mechanical polishing at 25° C. is 0.5 mPa·s or more and less than 10 mPa·s, it is easy to polish the wiring material at high speed, the viscosity is appropriate, and thus the composition for chemical-mechanical polishing can be supplied stably onto the polishing cloth.

<Anticorrosive>

The composition for chemical-mechanical polishing according to the present embodiment may contain an anticorrosive. Examples of the anticorrosive include benzotriazole and derivatives thereof. Here, the benzotriazole derivative refers to one in which one or more hydrogen atoms of benzotriazole are substituted with, for example, a carboxy group, a methyl group, an amino group, a hydroxy group, or the like. Specific examples of the benzotriazole derivative include 4-carboxybenzotriazole, 7-carboxybenzotriazole, benzotriazole butyl ester, 1-hydroxymethylbenzotriazole, 1-hydroxybenzotriazole, and salts thereof.

When the composition for chemical-mechanical polishing according to the present embodiment contains an anticorrosive, the content of the anticorrosive is preferably 1% by mass or less, and more preferably 0.001 to 0.1% by mass, when the total mass of the composition for chemical-mechanical polishing is 100% by mass.

<pH Adjuster>

The composition for chemical-mechanical polishing according to the present embodiment may further contain a pH adjuster, if necessary. Examples of the pH adjuster include bases such as potassium hydroxide, ethylenediamine, monoethanolamine, tetramethylammonium hydroxide (TMAH), tetraethylammonium hydroxide (TEAH), and ammonia; inorganic acids such as phosphoric acid, sulfuric acid, hydrochloric acid, and nitric acid; and salts thereof, and one or more of these can be used.

1.5. pH

The pH of the composition for chemical-mechanical polishing according to the present embodiment is not particularly limited, but is preferably 2 or more and 5 or less, and particularly preferably 2 or more and 4 or less. When the pH is in the above range, the dispersibility of the component (A) in the composition for chemical-mechanical polishing is improved, and the storage stability of the composition for chemical-mechanical polishing is improved, which is preferable.

The pH of the composition for chemical-mechanical polishing according to the present embodiment can be adjusted by, for example, appropriately increasing or decreasing the content of the organic acid or the pH adjuster.

In the present invention, the pH refers to a hydrogen ion exponent, and the value thereof can be measured by using a commercially available pH meter (for example, a benchtop pH meter manufactured by HORIBA, Ltd.) under the condition of 25° C. and 1 atm.

1.6. Application

The composition for chemical-mechanical polishing according to the present embodiment is suitable as a polishing material for chemical-mechanical polishing of a semiconductor substrate having a plurality of kinds of materials that configure a semiconductor device. For example, the semiconductor substrate may have a conductive metal such as tungsten and cobalt, as well as an insulating film material such as silicon oxide film, silicon nitride film, and amorphous silicon, and a barrier metal material such as titanium, titanium nitride, and tantalum nitride.

A particularly suitable polishing target for the composition for chemical-mechanical polishing according to the present embodiment is an object to be processed such as a semiconductor substrate provided with a wiring layer containing tungsten. Specific examples thereof include an object to be processed having a silicon oxide film having a via hole and a tungsten film provided on the silicon oxide film via a barrier metal film. By using the composition for chemical-mechanical polishing according to the present embodiment, not only the tungsten film can be polished flat and at high speed, but also the surface to be polished in which the tungsten film and the insulating film such as the silicon oxide film coexist can be polished flat and at high speed while suppressing the occurrence of polishing defects.

1.7. Method for Preparing Composition for Chemical-Mechanical Polishing

The composition for chemical-mechanical polishing according to the present embodiment can be prepared by dissolving or dispersing each of the above-described components in a liquid medium such as water. The method for dissolving or dispersing is not particularly limited, and any method may be applied as long as uniform dissolution or dispersion is possible. Further, the mixing order and mixing method of each of the above-described components are not particularly limited.

Further, the composition for chemical-mechanical polishing according to the present embodiment can also be used by being prepared as a concentrated type stock solution and diluted with a liquid medium such as water at the time of use.

2. Chemical-Mechanical Polishing Method

The polishing method according to the embodiment of the present invention includes a step of polishing a semiconductor substrate by using the above-described composition for chemical-mechanical polishing. Hereinafter, a specific example of the chemical-mechanical polishing method according to the present embodiment will be described in detail with reference to the drawings.

2.1. Object to be Processed

Figure 1:
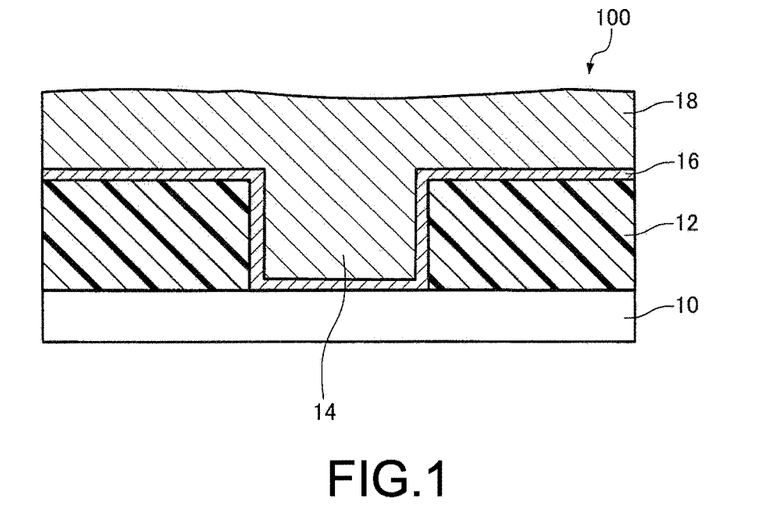
FIG. 1 is a sectional view schematically showing an object to be processed used for chemical-mechanical polishing according to the present embodiment.

FIG. 1 is a sectional view schematically showing an object to be processed suitable for use in the chemical-mechanical polishing method according to the present embodiment. An object to be processed 100 is formed by going through the following steps (1) to (4).

(1) First, as shown in FIG. 1, a base 10 is prepared. The base 10 may be composed of, for example, a silicon substrate and a silicon oxide film formed on the silicon substrate. Furthermore, a functional device such as a transistor (not shown) may be formed on the base 10. Next, a silicon oxide film 12 which is an insulating film is formed on the base 10 by a thermal oxidation method.

(2) Next, the silicon oxide film 12 is patterned. Using the obtained pattern as a mask, a via hole 14 is formed on the silicon oxide film 12 by a photolithography method.

(3) Next, a barrier metal film 16 is formed on the surface of the silicon oxide film 12 and the inner wall surface of the via hole 14 by applying sputtering or the like. Since the electrical contact between tungsten and silicon is not very good, good electrical contact is realized by interposing the barrier metal film. Examples of the barrier metal film 16 include titanium and/or titanium nitride.

(4) Next, the CVD method is applied to deposit a tungsten film 18.

By the above steps, the object to be processed 100 is formed.

2.2. Chemical-Mechanical Polishing Method 2.2.1. First Polishing Step

Figure 2:
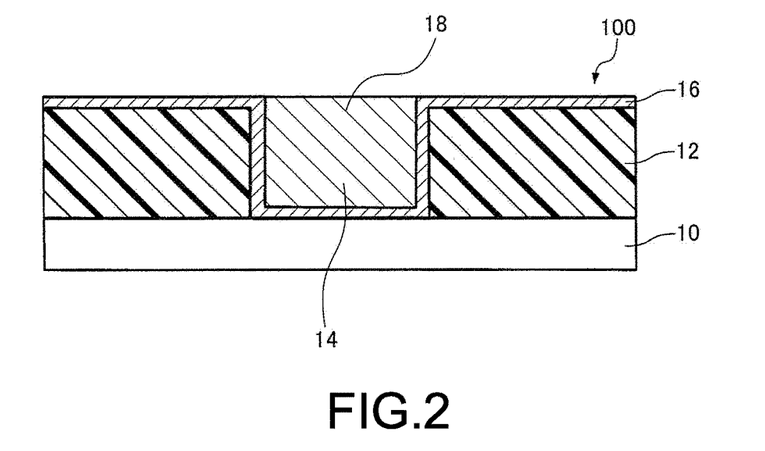
FIG. 2 is a sectional view schematically showing the object to be processed after a first polishing step.

FIG. 2 is a sectional view schematically showing an object to be processed at the end of the first polishing step. In the first polishing step, as shown in FIG. 2, the tungsten film 18 is polished using the above-described composition for chemical-mechanical polishing until the barrier metal film 16 is exposed.

2.2.2. Second Polishing Step

Figure 3:
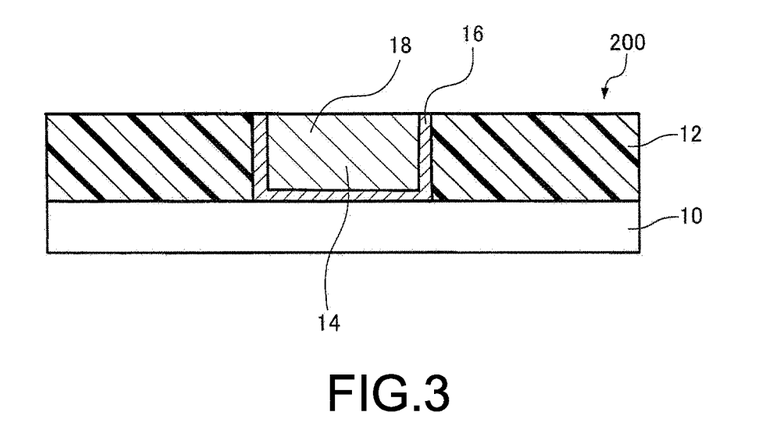
FIG. 3 is a sectional view schematically showing the object to be processed after a second polishing step.

FIG. 3 is a sectional view schematically showing an object to be processed at the end of the second polishing step. In the second polishing step, as shown in FIG. 3, the silicon oxide film 12, the barrier metal film 16, and the tungsten film 18 are polished using the above-described composition for chemical-mechanical polishing. By going through the second polishing step, it is possible to produce a next-generation semiconductor device 200 having excellent flatness of the surface to be polished.

As described above, the above-described composition for chemical-mechanical polishing is suitable as a polishing material for chemical-mechanical polishing of a semiconductor substrate having a plurality of kinds of materials that configure a semiconductor device. Therefore, in the first polishing step and the second polishing step of the chemical-mechanical polishing method according to the present embodiment, the composition for chemical-mechanical polishing having the same composition can be used, and thus the throughput of the production line is improved.

2.3. Chemical-Mechanical Polishing Device

Figure 4:
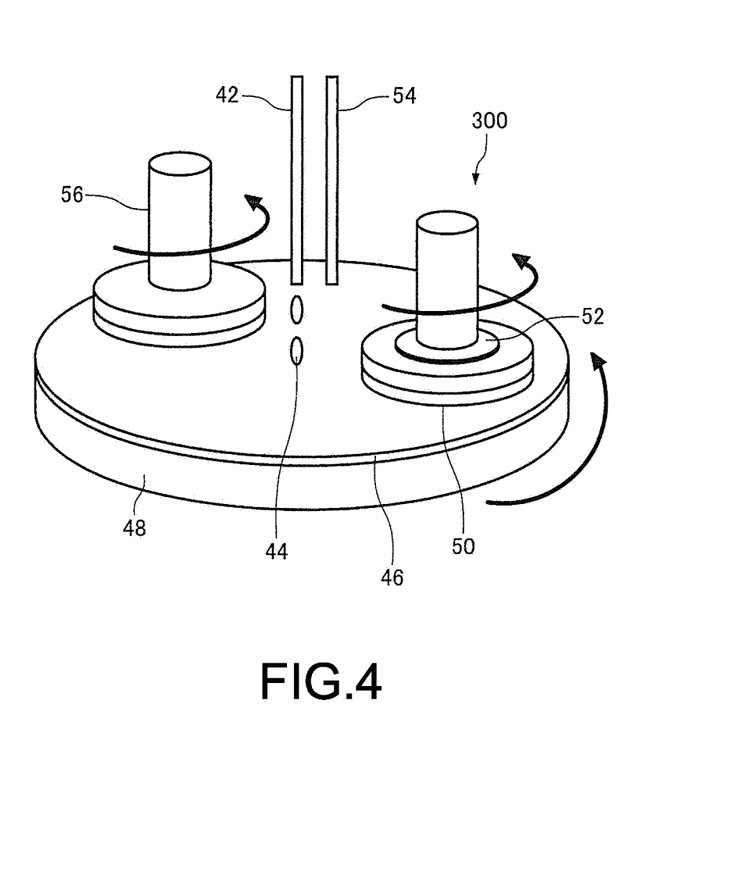
FIG. 4 is a perspective view schematically showing a chemical-mechanical polishing device.

For example, a polishing device 300 as shown in FIG. 4 can be used in the first polishing step and the second polishing step described above. FIG. 4 is a perspective view schematically showing the polishing device 300. The first polishing step and the second polishing step described above are performed by supplying a slurry (composition for chemical-mechanical polishing) 44 from a slurry supply nozzle 42, and by bringing a carrier head 52 holding a semiconductor substrate 50 into contact therewith while rotating a turntable 48 to which the polishing cloth 46 is attached. In addition, FIG. 4 also shows a water supply nozzle 54 and a dresser 56.

The polishing load of the carrier head 52 can be selected in the range of 10 to 980 hPa, and is preferably 30 to 490 hPa. The rotation speed of the turntable 48 and the carrier head 52 can be appropriately selected within the range of 10 to 400 rpm, and is preferably 30 to 150 rpm. The flow rate of the slurry (composition for chemical-mechanical polishing) 44 supplied from the slurry supply nozzle 42 can be selected within the range of 10 to 1,000 mL/min, and preferably 50 to 400 mL/min.

Examples of commercially available polishing device include, for example, model "EPO-112" and "EPO-222" manufactured by Ebara Corporation; model "LGP-510" and "LGP-552" manufactured by Lapmaster SFT Corporation; model "Mirra" and "Reflexion" manufactured by Applied Materials, Inc.; model "POLI-400L" manufactured by G&P Technology Co. Ltd.; and model "Reflexion LK" manufactured by Applied Materials, Inc.

3. Examples

Hereinafter, the present invention will be described with reference to Examples, but the present invention is not limited to these Examples. In addition, "part" and "%" in this Example are based on mass unless otherwise specified.

3.1. Preparation of Silica Particle Aqueous Dispersion 3.1.1. Preparation of Aqueous Dispersion A 2000 g of PL-3 (19.5% colloidal silica manufactured by Fuso Chemical Industry Co., Ltd.) was placed in a flask having a capacity of 2000 cm$^3$ and heated to 60° C. Then, 6.0 g of (3-triethoxysilyl)propylsuccinic anhydride (manufactured by Tokyo Chemical Industry Co., Ltd.) was added, the mixture was heated at 60° C., and the reaction was continued for 4 hours. After cooling, an aqueous dispersion A of carboxylic acid-modified silica particles was obtained.

3.1.2. Preparation of Aqueous Dispersion B

A mixed liquid of 1522.2 g of tetramethoxysilane (manufactured by Tokyo Chemical Industry Co., Ltd.) and 413.0 g of methanol was added dropwise to a mixed liquid of 787.9 g of pure water, 786.0 g of 25% ammonia water (manufactured by FUJIFILM Wako Pure Chemical Corporation), and 12924 g of methanol (manufactured by FUJIFILM Wako Pure Chemical Corporation) for 55 minutes while keeping the liquid temperature at 35° C. to obtain a hydrolyzed silica sol dispersion. This sol was heated and concentrated to 2900 ml under normal pressure. While further heating and distilling this concentrate under normal pressure, pure water was added dropwise while keeping the capacity constant. At the time when it was confirmed that the column top temperature reached 100° C. and the pH became 8 or less, dropping of pure water was completed, and a silica sol was obtained. A mixed liquid of 19.0 g of methanol and 1.0 g of 3-aminopropyltrimethoxysilane was added dropwise to 540 g of the prepared silica sol for 10 minutes while keeping the liquid temperature, and then reflux was performed under normal pressure for 2 hours. Then, pure water was added dropwise while keeping the capacity constant. At the time when the column top temperature reached 100° C., the dropping of pure water was completed, and an aqueous dispersion of amino-modified silica particles was obtained. The obtained aqueous dispersion was vacuum dried at 150° C. for 24 hours to obtain amino-modified silica particles.

The obtained amino-modified silica particles were dried at 70° C. for 12 hours. By weighing 1.4 g of malonic acid (manufactured by Tokyo Chemical Industry Co., Ltd.) into a three-necked flask with nitrogen flow in advance, and by adding 20.0 ml of N-methyl-2-pyrrolidone (NMP manufactured by FUJIFILM Wako Pure Chemical Corporation), the malonic acid was stirred until the malonic acid was completely dissolved. 2.0 g of amino-modified silica particles were added to this reaction solution, and the mixture was stirred for 1 hour. Then, 6.2 g of (2,3-dihydro-2-thioxo-3-benzoxazolyl)diphenyl phosphonate (manufactured by Tokyo Chemical Industry Co., Ltd.) and 1.4 ml of triethylamine (manufactured by FUJIFILM Wako Pure Chemical Corporation) were added, and the mixture was stirred at room temperature for 24 hours. The reaction solution was allowed to stand overnight, the particles were precipitated, and the supernatant solution was discarded. Then, the particles were washed with NMP several times to obtain carboxylic acid-modified silica particles. The recovered particles were vacuum dried at 100° C. for 12 hours to remove the solvent. An appropriate amount of pure water was added to obtain an aqueous dispersion B of 20% carboxylic acid-modified silica particles.

3.1.3. Preparation of Aqueous Dispersion C

Amino-modified silica particles were obtained by the same method as that in the above-described "3.1.2. Preparation of aqueous dispersion B". The obtained amino-modified silica particles were vacuum dried at 70° C. for 12 hours. By weighing 1.4 g of citric acid (manufactured by Tokyo Chemical Industry Co., Ltd.) into a three-necked flask with nitrogen flow in advance, and by adding 20.0 ml of N-methyl-2-pyrrolidone (NMP), the malonic acid was stirred until the citric acid was completely dissolved. 2.0 g of amino-modified silica particles were added to this reaction solution, and the mixture was stirred for 1 hour. Then, 5.7 g of (2,3-dihydro-2-thioxo-3-benzoxazolyl)diphenyl phosphonate and 1.3 ml of triethylamine were added, and the mixture was stirred at room temperature for 24 hours. The reaction solution was allowed to stand overnight, the particles were precipitated, and the supernatant solution was discarded. Then, the particles were washed with NMP several times to obtain carboxylic acid-modified silica particles. The recovered particles were vacuum dried at 100° C. for 12 hours to remove the solvent. An appropriate amount of pure water was added to obtain an aqueous dispersion C of 20% carboxylic acid-modified silica particles.

3.1.4. Preparation of Aqueous Dispersion D 2000 g of PL-3 (19.5% colloidal silica manufactured by Fuso Chemical Industry Co., Ltd.) was placed in a flask having a capacity of 2000 cm$^3$ and heated to 60° C. Subsequently, 12.0 g of (3-triethoxysilyl)propylsuccinic anhydride was added as a silane coupling agent, the mixture was heated at 60° C., and the reaction was continued for 4 hours. After cooling, an aqueous dispersion D of carboxylic acid-modified silica particles was obtained.

3.1.5. Preparation of Aqueous Dispersion E 2000 g of PL-3 (19.5% colloidal silica manufactured by Fuso Chemical Industry Co., Ltd.) was placed in a flask having a capacity of 2000 cm$^3$ and heated to 60° C. Subsequently, 18.0 g of (3-triethoxysilyl)propylsuccinic anhydride was added as a silane coupling agent, the mixture was heated at 60° C., and the reaction was continued for 4 hours. After cooling, an aqueous dispersion E of carboxylic acid-modified silica particles was obtained.

3.1.6. Preparation of Aqueous Dispersion F 70 g of ammonia water having a concentration of 25% by mass, 40 g of ion-exchanged water, 175 g of ethanol, and 21 g of tetraethoxysilane were put into a flask having a capacity of 2000 cm$^3$, and the temperature was raised to 60° C. while stirring at 180 rpm. The mixture was stirred at 60° C. for 1 hour and then cooled to obtain a colloidal silica/alcohol dispersion. Next, the operation of removing the alcohol content while adding ion-exchanged water to the dispersion at 80° C. was repeated several times using an evaporator to remove the alcohol in the dispersion and prepare a silica dispersion having a solid content concentration of 15%.

5 g of acetic acid was put into 50 g of ion-exchanged water, and further, while stirring the mixture, 5 g of mercapto group-containing silane coupling agent (manufactured by Shin-Etsu Chemical Co., Ltd., trade name "KBE803") was gradually added dropwise. After 30 minutes, 1000 g of the prepared silica dispersion was added, and stirring was continued for another 1 hour. Then, 200 g of 310% hydrogen peroxide solution was put and left at room temperature for 48 hours to obtain an aqueous dispersion F containing silica particles having a sulfo group.

3.1.7. Preparation of Aqueous Dispersion G

A mixed liquid of 1522.2 g of tetramethoxysilane and 413.0 g of methanol was added dropwise to a mixed liquid of 787.9 g of pure water, 786.0 g of 26% ammonia water, and 12924 g of methanol for 55 minutes while keeping the solution temperature at 35° C. Then, the mixture was heated and concentrated to 2900 ml under normal pressure. While further heating and distilling this concentrate under normal pressure, pure water was added dropwise while keeping the capacity constant. At the time when it was confirmed that the column top temperature reached 100° C. and the pH became 8 or less, dropping of pure water was completed, and a silica dispersion was prepared.

A mixed liquid of 19.0 g of methanol and 1.0 g of 3-aminopropyltriethoxysilane was added dropwise to 540 g of the prepared silica dispersion for 10 minutes while keeping the liquid temperature, and then reflux was performed under normal pressure for 2 hours. Then, pure water was added dropwise while keeping the capacity constant. At the time when the column top temperature reached 100° C., the dropping of pure water was completed, and an aqueous dispersion G containing silica particles having an amino group was obtained.

3.2. Preparation of Composition for Chemical-Mechanical Polishing

Using hydrogen peroxide (30% aqueous solution manufactured by FUJIFILM Wako Pure Chemical Corporation) as an oxidizing agent, each component was added to a polyethylene container so as to have the compositions shown in Tables 1 to 3, the pH was adjusted to the pH shown in Tables 1 to 3 by further adding potassium hydroxide if necessary, and adjusted by pure water such that the total amount of all the components is 100 parts by mass, and accordingly, the compositions for chemical-mechanical polishing of each Example and each Comparative Example were prepared.

3.3. Evaluation Method 3.3.1. Polishing Speed Test

Using the composition for chemical-mechanical polishing obtained above, while a wafer with a CVD-W film of 300 nm with a diameter of 12 inches or a wafer with a p-TEOS film (silicon oxide film) of 300 nm with a diameter of 12 inches is used as an object to be polished, a chemical-mechanical polishing test was performed for 60 seconds under the following polishing conditions.

<Polishing Conditions>

Polishing device: model "Reflexion LK" manufactured by Applied Materials, Inc.
Polishing pad: "Porous polyurethane pad; H800-type1 (3-1S) 775" manufactured by Fujibo Holdings, Inc.
Composition for chemical-mechanical polishing supply speed: 300 mL/min
Surface plate rotation speed: 100 rpm
Head rotation speed: 90 rpm
Head pressing pressure: 2.5 psi Polishing speed (Å/min)=(thickness of film before polishing−thickness of film after polishing)/polishing time The thickness of the tungsten film was calculated by measuring the resistance by a DC four-probe method using a resistivity measuring machine (model "OmniMap RS100" manufactured by KLA-Tencor Corporation) by the following formula from this sheet resistance value and the volume resistivity of tungsten.

Film thickness (Å)=[Tungsten film volume resistivity (Ω·m)/Sheet resistance value (Ω)]×10$^{10}$ The evaluation criteria for the polishing speed test are as follows. Tables 1 to 3 also show the results of the polishing speed of the tungsten film, the results of the polishing speed of the silicon oxide film, and the evaluation results thereof.

(Evaluation Criteria)

[A] In a case where the tungsten polishing speed is 100 Å/min or more and the p-TEOS polishing speed is 200 Å/min or more, the polishing speeds of both are sufficiently high, and thus it is possible to easily ensure a speed balance with the polishing of other material films in the actual polishing of the semiconductor substrate. This case is determined as [A] which means good because this case is practical.

[B] In a case where the tungsten polishing speed is less than 100 Å/min or the p-TEOS polishing speed is less than 200 Å/min, the polishing speed of either or both is low. Therefore, this case is determined as [B] which means bad because this case is difficult to be practical.

3.3.2. Defect Evaluation

A wafer with a p-TEOS film having a diameter of 12 inches, which is an object to be polished, was polished for 2 minutes under the following conditions.

<Polishing Conditions>
Polishing device: model "Reflexion LK" manufactured by Applied Materials, Inc.
Polishing pad: "Porous polyurethane pad; H800-type1 (3-1S) 775" manufactured by Fujibo Holdings, Inc.
Composition for chemical-mechanical polishing supply speed: 300 mL/min
Surface plate rotation speed: 100 rpm
Head rotation speed: 90 rpm
Head pressing pressure: 2.5 psi With respect to the wafer with the p-TEOS film polished above, the total number of defects having a size of 90 nm or more was counted using a defect inspection device (model "Surfscan SP1" manufactured by KLA-Tencor Corporation). The evaluation criteria are as follows. The total number of defects per wafer and the evaluation results thereof are also shown in Tables 1 to 3.

(Evaluation Criteria)
[A] A case where the total number of defects per wafer is less than 500 is determined as [A] which means good.
[B] A case where the total number of defects per wafer is 500 or more is determined as [B] which means bad.

3.4. Evaluation Results

Tables 1 to 3 below show the compositions and each evaluation result of the compositions for chemical-mechanical polishing of each Example and each Comparative Example.

TABLE 1

| | | | Example 1 | Example 2 | Example 3 | Example 4 | Example 5 |
|---|---|---|---|---|---|---|---|
| Composition for chemical-mechanical polishing | Abrasive grain | Type | Aqueous dispersion A | Aqueous dispersion B | Aqueous dispersion C | Aqueous dispersion D | Aqueous dispersion E |
| | | Content (% by mass) | 2 | 2 | 2 | 2 | 2 |
| | Silane compound | Type | 3-triethoxysilyl-propyl succinic anhydride | 3-triethoxysilyl-propyl succinic anhydride | 3-triethoxysilyl-propyl succinic anhydride | 3-triethoxysilyl-propyl succinic anhydride | 3-triethoxysilyl-propyl succinic anhydride |
| | | Content (% by mass) | 0.005 | 0.005 | 0.005 | 0.005 | 0.005 |
| | Additive | Type | Citric acid | Citric acid | Citric acid | Citric acid | Citric acid |
| | | Content (% by mass) | 0.20 | 0.20 | 0.20 | 0.20 | 0.20 |
| | | Type | | | | | |
| | | Content (% by mass) | | | | | |
| | Oxidizing agent | Content (% by mass) | 2 | 2 | 2 | 2 | 2 |
| | | pH | 3.0 | 3.0 | 3.0 | 3.0 | 3.0 |
| Evaluation item | Polishing speed | Tungsten film polishing speed (Å/min.) | 131 | 124 | 135 | 132 | 132 |
| | | Silicon oxide film polishing speed (Å/min.) | 215 | 218 | 228 | 217 | 218 |
| | | Evaluation result | A | A | A | A | A |
| | Defect evaluation | Number of defects | 212 | 219 | 365 | 342 | 387 |
| | | Evaluation result | A | A | A | A | A |

| | | | Example 6 | Example 7 | Example 8 | Example 9 | Example 10 |
|---|---|---|---|---|---|---|---|
| Composition for chemical-mechanical polishing | Abrasive grain | Type | Aqueous dispersion A | Aqueous dispersion A | Aqueous dispersion A | Aqueous dispersion A | Aqueous dispersion A |
| | | Content (% by mass) | 2 | 2 | 2 | 2 | 2 |
| | Silane compound | Type | 3-mercaptopropyl trimethoxysilan | 3-aminopropyltri methoxysilane | 3-triethoxysilyl-propyl succinic anhydride | 3-triethoxysilyl-propyl succinic anhydride | 3-triethoxysilyl-propyl succinic anhydride |
| | | Content (% by mass) | 0.005 | 0.005 | 0.005 | 0.005 | 0.005 |
| | Additive | Type | Citric acid | Citric acid | Citric acid | Citric acid | Citric acid |
| | | Content (% by mass) | 0.20 | 0.20 | 0.20 | 0.20 | 0.20 |
| | | Type | | | Polyacrylic acid | Histidine | Arginine |
| | | Content (% by mass) | | | 0.01 | 0.02 | 0.02 |
| | Oxidizing agent | Content (% by mass) | 2 | 2 | 2 | 2 | 2 |
| | | pH | 3.0 | 3.0 | 3.0 | 3.0 | 3.0 |
| Evaluation item | Polishing speed | Tungsten film polishing speed (Å/min.) | 103 | 106 | 111 | 111 | 134 |
| | | Silicon oxide film polishing speed (Å/min.) | 217 | 216 | 202 | 220 | 225 |
| | | Evaluation result | A | A | A | A | A |
| | Defect evaluation | Number of defects | 342 | 358 | 153 | 264 | 249 |
| | | Evaluation result | A | A | A | A | A |

TABLE 2

|  |  |  | Example 11 | Example 12 | Example 13 | Example 14 | Example 15 |
|---|---|---|---|---|---|---|---|
| Composition for chemical-mechanical polishing | Abrasive grain | Type | Aqueous dispersion A | Aqueous dispersion A | Aqueous dispersion A | Aqueous dispersion A | Aqueous dispersion A |
|  |  | Content (% by mass) | 2 | 2 | 2 | 3 | 4 |
|  | Silane compound | Type | 3-triethoxysilyl-propyl succinic anhydride | 3-triethoxysilyl-propyl succinic anhydride | 3-triethoxysilyl-propyl succinic anhydride | 3-triethoxysilyl-propyl succinic anhydride | 3-triethoxysilyl-propyl succinic anhydride |
|  |  | Content (% by mass) | 0.005 | 0.005 | 0.011 | 0.005 | 0.005 |
|  | Additive | Type | Citric acid | Citric acid | Citric acid | Citric acid | Citric acid |
|  |  | Content (% by mass) | 0.20 | 0.20 | 0.20 | 0.20 | 0.20 |
|  |  | Type | Monoethanolamine | TEAH |  |  |  |
|  |  | Content (% by mass) | 0.02 | 0.02 |  |  |  |
|  | Oxidizing agent | Content (% by mass) | 2 | 2 | 2 | 2 | 2 |
|  |  | pH | 3.0 | 3.0 | 3.0 | 3.0 | 3.0 |
| Evaluation item | Polishing speed | Tungsten film polishing speed (Å/min.) | 115 | 120 | 102 | 150 | 160 |
|  |  | Silicon oxide film polishing speed (Å/min.) | 223 | 220 | 248 | 331 | 350 |
|  |  | Evaluation result | A | A | A | A | A |
|  | Defect evaluation | Slumber of defects | 272 | 430 | 499 | 322 | 389 |
|  |  | Evaluation result | A | A | A | A | A |

|  |  |  | Example 16 | Example 17 | Example 18 | Example 19 | Example 20 |
|---|---|---|---|---|---|---|---|
| Composition for chemical-mechanical polishing | Abrasive grain | Type | Aqueous dispersion A | Aqueous dispersion A | Aqueous dispersion A | Aqueous dispersion A | Aqueous dispersion A |
|  |  | Content (% by mass) | 2 | 2 | 2 | 2 | 2 |
|  | Silane compound | Type | 3-triethoxysilyl-propyl succinic anhydride | 3-triethoxysilyl-propyl succinic anhydride | 3-triethoxysilyl-propyl succinic anhydride | 3-triethoxysilyl-propyl succinic anhydride | 3-triethoxysilyl-propyl succinic anhydride |
|  |  | Content (% by mass) | 0.005 | 0.005 | 0.005 | 0.005 | 0.005 |
|  | Additive | Type | Citric acid | Maleic acid | Malonic acid | Malic acid | Maleic acid |
|  |  | Content (% by mass) | 0.05 | 0.20 | 0.20 | 0.25 | 0.20 |
|  |  | Type |  |  |  |  |  |
|  |  | Content (% by mass) |  |  |  |  |  |
|  | Oxidizing agent | Content (% by mass) | 2 | 2 | 2 | 2 | 1 |
|  |  | pH | 3.0 | 3.0 | 3.0 | 3.0 | 3.0 |
| Evaluation item | Polishing speed | Tungsten film polishing speed (Å/min.) | 120 | 100 | 122 | 150 | 110 |
|  |  | Silicon oxide film polishing speed (Å/min.) | 200 | 240 | 233 | 250 | 243 |
|  |  | Evaluation result | A | A | A | A | A |
|  | Defect evaluation | Slumber of defects | 230 | 220 | 198 | 342 | 214 |
|  |  | Evaluation result | A | A | A | A | A |

TABLE 3

|  |  |  | Example 21 | Example 22 | Example 23 | Example 24 | Example 25 |
|---|---|---|---|---|---|---|---|
| Composition for chemical-mechanical polishing | Abrasive grain | Type | Aqueous dispersion A | Aqueous dispersion A | Aqueous dispersion A | Aqueous dispersion A | Aqueous dispersion A |
|  |  | Content (% by mass) | 2 | 2 | 2 | 2 | 2 |
|  | Silane compound | Type | 3-triethoxysilyl-propyl succinic anhydride | 3-triethoxysilyl-propyl succinic anhydride | 3-triethoxysilyl-propyl succinic anhydride | 3-triethoxysilyl-propyl succinic anhydride | 3-triethoxysilyl-propyl succinic anhydride |
|  |  | Content (% by mass) | 0.005 | 0.005 | 0.005 | 0.0025 | 0.0075 |
|  | Additive | Type | Maleic acid | Maleic acid | Maleic acid | Citric acid | Citric acid |
|  |  | Content (% by mass) | 0.20 | 0.20 | 0.03 | 0.20 | 0.20 |
|  | Oxidizing agent | Content (% by mass) | 3 | 2 | 2 | 2 | 2 |
|  |  | pH | 3.0 | 2.2 | 3.5 | 3.0 | 3.0 |
| Evaluation item | Polishing speed | Tungsten film polishing speed (Å/min.) | 148 | 112 | 120 | 131 | 120 |
|  |  | Silicon oxide film polishing speed (Å/min.) | 230 | 349 | 203 | 243 | 243 |

TABLE 3-continued

|  | Evaluation result | A | A | A | A | A |
|---|---|---|---|---|---|---|
| Defect | Number of defects | 200 | 432 | 235 | 200 | 489 |
| evaluation | Evaluation result | A | A | A | A | A |

|  |  |  | Comparative Example 1 | Comparative Example 2 | Comparative Example 3 | Comparative Example 4 |
|---|---|---|---|---|---|---|
| Composition for chemical-mechanical polishing | Abrasive grain | Type | PL-3 | Aqueous dispersion F | Aqueous dispersion G | Aqueous dispersion A |
|  |  | Content (% by mass) | 2 | 2 | 2 | 2 |
|  | Silane compound | Type | 3-triethoxysilyl-propyl succinic anhydride | 3-triethoxysilyl-propyl succinic anhydride | 3-triethoxysilyl-propyl succinic anhydride | — |
|  |  | Content (% by mass) | 0.005 | 0.005 | 0.005 | 0 |
|  | Additive | Type | Citric acid | Maleic acid | Maleic acid | Citric acid |
|  |  | Content (% by mass) | 0.20 | 0.20 | 0.20 | 0.20 |
|  | Oxidizing agent | Content (% by mass) | 2 | 2 | 2 | 2 |
|  |  | pH | 3.0 | 3.0 | 3.0 | 3.0 |
| Evaluation item | Polishing speed | Tungsten film polishing speed (Å/min.) | 156 | 98 | 167 | 151 |
|  |  | Silicon oxide film polishing speed (Å/min.) | 570 | 47 | 652 | 247 |
|  |  | Evaluation result | A | B | A | A |
|  | Defect evaluation | Number of defects | 817 | 232 | 3950 | 560 |
|  |  | Evaluation result | B | A | B | B |

The following products or reagents were used for each component in Tables 1 to 3 above. The content of the abrasive grains in the Tables 1 to 3 above represents the solid content concentration of each aqueous dispersion.

<Abrasive Grain>
Aqueous dispersions A to G: Aqueous dispersions A to G of silica particles prepared above
PL-3: trade name "PL-3" manufactured by Fuso Chemical Co., Ltd., colloidal silica, average particle size 70 nm <Silane Compound>
3-triethoxysilylpropyl succinic anhydride: trade name "[(3-Triethoxysilyl)propyl]succinic Anhydride" manufactured by Tokyo Chemical Industry Co., Ltd.
3-Mercaptopropyltrimethoxysilane: trade name "(3-Mercaptopropyl)trimethoxysilane" manufactured by Tokyo Chemical Industry Co., Ltd.
3-aminopropyltrimethoxysilane: trade name "[3-Aminopropyltrimethoxysilane]" manufactured by Tokyo Chemical Industry Co., Ltd.

<Organic Acid>
Citric acid: trade name "Citric Acid" manufactured by Tokyo Chemical Industry Co., Ltd.
Maleic acid: trade name "Maleic Acid" manufactured by Tokyo Chemical Industry Co., Ltd.
Malonic acid: trade name "Malonic Acid" manufactured by Tokyo Chemical Industry Co., Ltd.
Malic acid: trade name "DL-Apple Acid" manufactured by Tokyo Chemical Industry Co., Ltd.
Histidine: trade name "L-Histidine" manufactured by Tokyo Chemical Industry Co., Ltd.
Arginine: trade name "L-(+)-Arginine" manufactured by Tokyo Chemical Industry Co., Ltd.

<Water-Soluble Polymer>
Polyacrylic acid: trade name "Julimer AC-10L" manufactured by Toagosei Co., Ltd., Mw=20,000 to 30,000

<pH Adjuster>
Monoethanolamine: trade name "2-Aminoethanol" manufactured by Tokyo Chemical Industry Co., Ltd.
TEAH: trade name "Tetraethylammonium Hydroxide (10% in Water)" manufactured by Tokyo Chemical Industry Co., Ltd., tetraethylammonium hydroxide When the compositions for chemical-mechanical polishing of Examples 1 to 25 were used, it was possible to polish both the tungsten film and the p-TEOS film at a practical polishing speed, and it was possible to reduce the occurrence of surface defects of the p-TEOS film after polishing.

The present invention is not limited to the above-described embodiment, and various modifications are possible. For example, the present invention includes substantially the same configurations (for example, configurations with the same function, method, and result, or configurations with the same objective and effect) as those described in the embodiments. The present invention also includes a configuration in which a non-essential part of the configuration described in the embodiment is replaced. Further, the present invention includes a configuration having the same action and effect as the configuration described in the embodiment or a configuration capable of achieving the same object. Further, the present invention includes a configuration in which a known technology is added to the configuration described in the embodiment.

What is claimed is:

1. A composition for chemical-mechanical polishing comprising
   (A) silica particles having a functional group represented by general formula (1) below, and
   (B) a silane compound, $$—COO^-M^+ \quad (1)$$

wherein $M^+$ represents a monovalent cation,
   a content of the component (B) is 0.0001% by mass or more and 0.02% by mass or less.

2. The composition for chemical-mechanical polishing according to claim 1, further comprising an organic acid.

3. The composition for chemical-mechanical polishing according to claim 1, further comprising an oxidizing agent.

4. The composition for chemical-mechanical polishing according to claim 1, wherein a pH is 2 or more and 5 or less.

5. The composition for chemical-mechanical polishing according claim 1, wherein the component (B) is at least one selected from compounds represented by the following general formulas (2), (3), and (4):

$$Si(OR^1)_4 \quad (2)$$

$$SiR^2{}_m(OR^3)_n(R^4-NR^5{}_2)_p \quad (3)$$

$$SiR^2{}_m(OR^3)_nR^5{}_p \quad (4)$$

in Formula (2), each of a plurality of $R^1$ independently represents a monovalent hydrocarbon group; in Formula (3), $R^4$ represents a divalent hydrocarbon group; in Formulas (3) and (4), each of $R^2$ and $R^3$ independently represents a monovalent hydrocarbon group, $R^5$ represents hydrogen atoms or a monovalent organic group having 1 to 10 carbon atoms each independently containing or not containing heteroatoms, m is an integer of 0 to 2, n is an integer of 1 to 3, p is 1 or 2, and m+n+p=4.

6. The composition for chemical-mechanical polishing according to claim 5, further comprising an organic acid.

7. The composition for chemical-mechanical polishing according to claim 1, wherein the component (B) is at least one selected from tetramethoxysilane, tetraethoxysilane, tetrapropoxysilane, tetraphenoxysilane, 3-aminopropyltrimethoxysilane, N-(2-aminoethyl)-3-aminopropyltrimethoxysilane, 3-aminopropyltriethoxysilane, aminopropyldimethylethoxysilane, aminopropylmethyldiethoxysilane, N-phenyl-3-aminopropyltrimethoxysilane, 3-trimethoxysilylpropyl succinic anhydride, 3-triethoxysilylpropyl succinic anhydride, 3-mercaptopropylmethyldimethoxysilane, and 3-mercaptopropyltrimethoxysilane.

8. The composition for chemical-mechanical polishing according to claim 7, further comprising an organic acid.

9. The composition for chemical-mechanical polishing according to claim 1, wherein the component (A) is silica particles in which the functional group represented by the general formula (1) is fixed on a surface thereof via a covalent bond.

10. The composition for chemical-mechanical polishing according claim 9, wherein the component (B) is at least one selected from compounds represented by the following general formulas (2), (3), and (4):

$$Si(OR^1)_4 \quad (2)$$

$$SiR^2{}_m(OR^3)_n(R^4-NR^5{}_2)_p \quad (3)$$

$$SiR^2{}_m(OR^3)_nR^5{}_p \quad (4)$$

in Formula (2), each of a plurality of $R^1$ independently represents a monovalent hydrocarbon group; in Formula (3), $R^4$ represents a divalent hydrocarbon group; in Formulas (3) and (4), each of $R^2$ and $R^3$ independently represents a monovalent hydrocarbon group, $R^5$ represents hydrogen atoms or a monovalent organic group having 1 to 10 carbon atoms each independently containing or not containing heteroatoms, m is an integer of 0 to 2, n is an integer of 1 to 3, p is 1 or 2, and m+n+p=4.

11. The composition for chemical-mechanical polishing according to claim 9, wherein the component (B) is at least one selected from tetramethoxysilane, tetraethoxysilane, tetrapropoxysilane, tetraphenoxysilane, 3-aminopropyltrimethoxysilane, N-(2-aminoethyl)-3-aminopropyltrimethoxysilane, 3-aminopropyltriethoxysilane, aminopropyldimethylethoxysilane, aminopropylmethyldiethoxysilane, N-phenyl-3-aminopropyltrimethoxysilane, 3-trimethoxysilylpropyl succinic anhydride, 3-triethoxysilylpropyl succinic anhydride, 3-mercaptopropylmethyldimethoxysilane, and 3-mercaptopropyltrimethoxysilane.

12. The composition for chemical-mechanical polishing according to claim 9, further comprising an organic acid.

13. The composition for chemical-mechanical polishing according to claim 1, wherein a total mass of the composition for chemical-mechanical polishing is 100% by mass, a content of the component (A) is 0.1% by mass or more and 10% by mass or less.

14. The composition for chemical-mechanical polishing according to claim 13, wherein the component (A) is silica particles in which the functional group represented by the general formula (1) is fixed on a surface thereof via a covalent bond.

15. The composition for chemical-mechanical polishing according claim 13, wherein the component (B) is at least one selected from compounds represented by the following general formulas (2), (3), and (4):

$$Si(OR^1)_4 \quad (2)$$

$$SiR^2{}_m(OR^3)_n(R^4-NR^5{}_2)_p \quad (3)$$

$$SiR^2{}_m(OR^3)_nR^5{}_p \quad (4)$$

in Formula (2), each of a plurality of $R^1$ independently represents a monovalent hydrocarbon group; in Formula (3), $R^4$ represents a divalent hydrocarbon group; in Formulas (3) and (4), each of $R^2$ and $R^3$ independently represents a monovalent hydrocarbon group, $R^5$ represents hydrogen atoms or a monovalent organic group having 1 to 10 carbon atoms each independently containing or not containing heteroatoms, m is an integer of 0 to 2, n is an integer of 1 to 3, p is 1 or 2, and m+n+p=4.

16. The composition for chemical-mechanical polishing according to claim 13, wherein the component (B) is at least one selected from tetramethoxysilane, tetraethoxysilane, tetrapropoxysilane, tetraphenoxysilane, 3-aminopropyltrimethoxysilane, N-(2-aminoethyl)-3-aminopropyltrimethoxysilane, 3-aminopropyltriethoxysilane, aminopropyldimethylethoxysilane, aminopropylmethyldiethoxysilane, N-phenyl-3-aminopropyltrimethoxysilane, 3-trimethoxysilylpropyl succinic anhydride, 3-triethoxysilylpropyl succinic anhydride, 3-mercaptopropylmethyldimethoxysilane, and 3-mercaptopropyltrimethoxysilane.

17. The composition for chemical-mechanical polishing according to claim 13, further comprising an organic acid.

18. The composition for chemical-mechanical polishing according to claim 13, further comprising an oxidizing agent.

19. A chemical-mechanical polishing method comprising: a step of polishing a semiconductor substrate using the composition for chemical-mechanical polishing according to claim 1.

20. The chemical-mechanical polishing method according to claim 19, wherein the semiconductor substrate has a part comprising at least one selected from a group consisting of silicon oxide and tungsten.

* * * * *